US012565418B2

(12) United States Patent
Basavanna et al.

(10) Patent No.: US 12,565,418 B2
(45) Date of Patent: Mar. 3, 2026

(54) SEMICONDUCTOR DEVICE

(71) Applicant: Infineon Technologies AG, Neubiberg (DE)

(72) Inventors: Abhiraj Basavanna, Munich (DE); Somu Goswami, Munich (DE); Andreas Bogner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 548 days.

(21) Appl. No.: 18/065,978

(22) Filed: Dec. 14, 2022

(65) Prior Publication Data
US 2023/0294976 A1 Sep. 21, 2023

(30) Foreign Application Priority Data

Feb. 1, 2022 (EP) .................................... 22154622

(51) Int. Cl.
*B81B 3/00* (2006.01)

(52) U.S. Cl.
CPC .... *B81B 3/0051* (2013.01); *B81B 2201/0221* (2013.01); *B81B 2201/0235* (2013.01); *B81B 2201/0264* (2013.01); *B81B 2201/0285* (2013.01); *B81B 2203/0127* (2013.01)

(58) Field of Classification Search
CPC ................ B81B 3/0021; B81B 3/0051; B81B 2201/0221; B81B 2201/0235; B81B 2201/0264; B81B 2201/0285; B81B 2203/0127; B81B 2203/053; B81B 7/02; G01H 11/08; G01L 9/0047; G01L 9/0054; G01L 9/0073; G01P 15/125
See application file for complete search history.

(56) References Cited

U.S. PATENT DOCUMENTS

| | | | | |
|---|---|---|---|---|
| 2008/0178675 | A1* | 7/2008 | Okada ................. | G01P 15/0802 |
| | | | | 73/514.32 |
| 2017/0108336 | A1* | 4/2017 | Boysel .............. | G01C 19/5712 |
| 2017/0156002 | A1* | 6/2017 | Han ...................... | H04R 31/006 |
| 2021/0385584 | A1* | 12/2021 | Goswami ........... | G01P 15/0802 |
| 2022/0402752 | A1* | 12/2022 | Goswami ................ | G01P 15/18 |

FOREIGN PATENT DOCUMENTS

| | | | |
|---|---|---|---|
| EP | 0480471 A2 | | 4/1992 |
| JP | 11230760 A | * | 8/1999 |
| JP | H11230760 A | | 8/1999 |

* cited by examiner

*Primary Examiner* — Moazzam Hossain
(74) *Attorney, Agent, or Firm* — Slater Matsil, LLP

(57) ABSTRACT

A semiconductor device for use in a sensor device has a deformable membrane for the measurement of an acceleration, a vibration, or a pressure. The semiconductor device includes a deformable membrane having a membrane border; a structure holding the deformable membrane in correspondence of the membrane border; at least one electric contact to obtain an electric signal indicative of deformation of the deformable membrane; and mass elements suspended from the membrane.

20 Claims, 7 Drawing Sheets

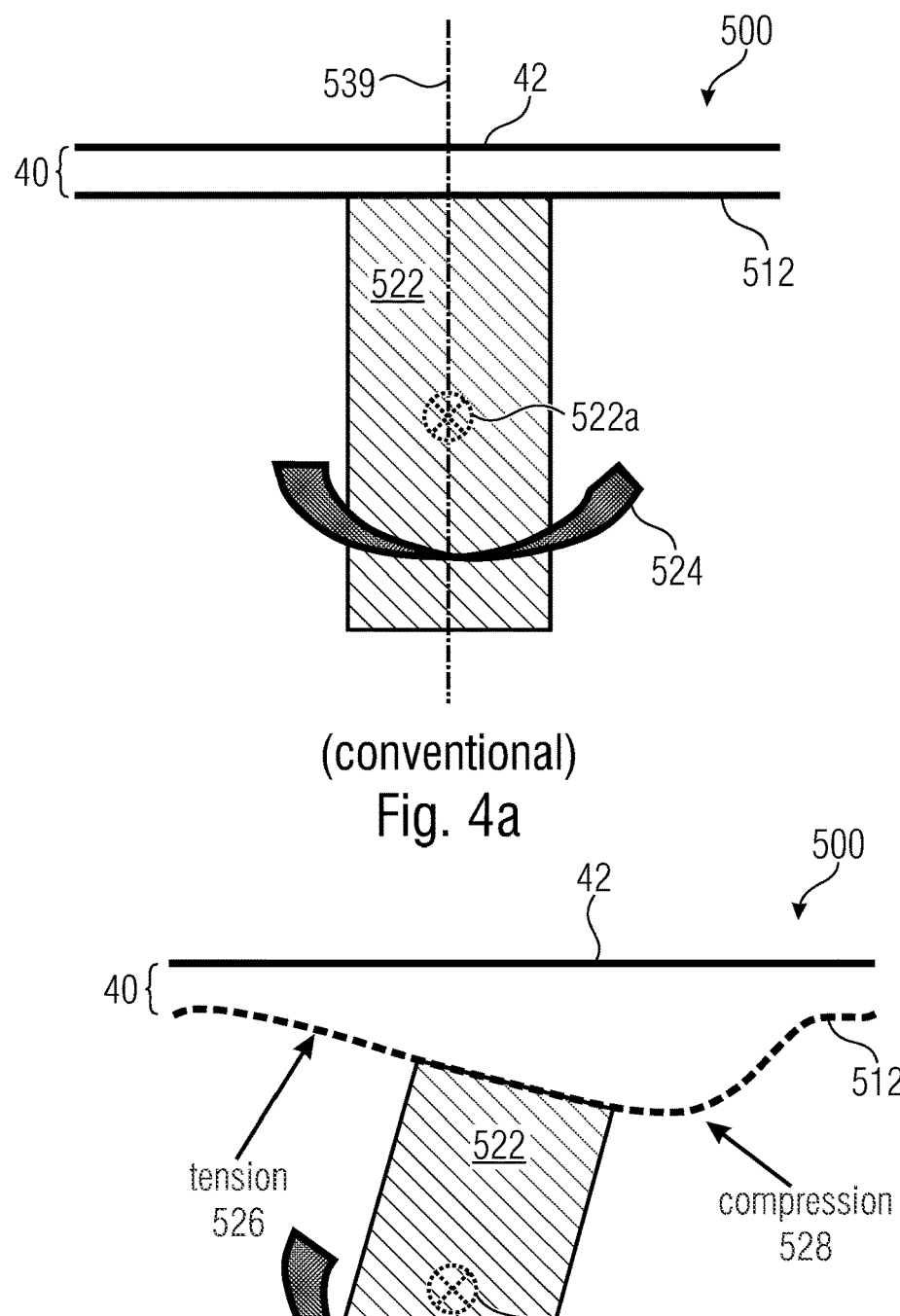
(conventional)
Fig. 4a
(conventional)
Fig. 4b

600

SEMICONDUCTOR DEVICE

CROSS-REFERENCE TO RELATED APPLICATIONS

This application claims the benefit of European Patent Application No. 22154622, filed on Feb. 1, 2022, which application is hereby incorporated herein by reference.

TECHNICAL FIELD

Examples here disclosed mainly relate to a semiconductor device having a deformable membrane, e.g. for the measurement of at least one of an acceleration, a vibration, or a pressure. Examples also relate to a sensor device including the semiconductor device. Examples also refer to a method for manufacturing the semiconductor device and the sensor device. The semiconductor device may be a micro electro-mechanical system, MEMS.

BACKGROUND

A MEMS semiconductor device with a deformable membrane, for the measurement of an acceleration, a vibration, or a pressure, may have one mass element attached to the membrane. Under the effect of a pressure, acceleration or vibration, the mass element may move, thereby deforming the membrane. Information on the membrane's deformation is provided by an electric signal, e.g. through a capacitive, piezoelectric, or resistive technique.

The electric signal is, however, affected by noise, which is caused by an imperfect deformation of the membrane. In some cases, noise on the electric signal could be filtered through electric filters. This filtering operation, however, would be too complicated. Notwithstanding, we have understood that it is preferable to directly avoid the insurgence of the cause of the noise, instead of filtering it. However, it is not easy to define particular solutions to the membrane, which is an element of extremely reduced thickness, and it is extremely difficult to force it to move correctly.

Techniques are pursued for coping with this inconvenient.

We have noted that the single mass element attached to the membrane, which is supposed to oscillate translatorily along an axis perpendicular to the extension of the membrane according to a piston mode, is actually also subjected to a tilting mode, which force it to also change orientation. Therefore, we have found some ways to compensate the tilting mode.

SUMMARY

In accordance to an aspect, there is provided a semiconductor device comprising:
   a deformable membrane having a membrane border;
   a structure holding the membrane in correspondence of the membrane border;
   at least one electric contact to obtain an electric signal indicative of the deformation of the membrane; and
   a plurality of mass elements suspended from.

In this way, the different tilting modes (each of which, taken singularly, would affect one mass element) actually compensate symmetrically with each other, with the effect of causing a translatorily oscillating mode, for the group of mass elements taken collectively, along a protrusion direction normal to the membrane (the translatorily oscillating mode may be the mode of the oscillation of the center of mass of the group of mass elements). Moreover reliability is increased by virtue of the use of a majority of mass elements with lower weight.

According to an aspect, the mass elements are each subjected to movements which generate, as a resultant, a translatorily oscillating mode. The tilting modes of the different mass elements therefore compensate with each other symmetrically, thereby alleviating the issues introduced by the tilting modes of the single mass elements.

According to an aspect, the center of mass of the plurality of mass elements is positioned in centered position (e.g., the center of the membrane). The groups of mass elements, considered as one single system, are in this case equi-centered with the center of the membrane, thereby increasing the symmetry, and maximizing the compensating effect.

According to an aspect, the semiconductor device comprises capacitor with variable capacitance and having a first electrode and a second electrode. The first electrode includes the membrane. The capacitance is varied in consequence of the membrane's deformation conditioned by the movement of the plurality of mass elements. The electric signal is therefore conditioned by the capacitance, and, accordingly, by the membrane's deformation (and therefore follows the acceleration, vibration, pressure experienced by the membrane and the mass elements).

According to an aspect, the membrane may be a piezo-electric membrane electrically connected to the at least one electric contact. The deformation of the membrane, conditioned by the movement of the plurality of mass elements, may cause the variation of the electric signal. The electric signal is therefore conditioned by the deformation of the membrane (and therefore follows the acceleration, vibration, pressure experienced by the membrane and the mass elements).

According to an aspect, the membrane may operate as a resistor with variable resistance, being subjected to a flow of electric current. The electric signal is conditioned by the deformation of the membrane conditioned by the movement of the plurality of mass elements. Therefore, the resistance follows the acceleration, vibration, pressure experienced by the membrane and the mass elements.

According to an aspect, the deformation of the membrane, at a first frequency, is conditioned by a compensation between the tilting modes singularly affecting the mass elements generating a translatorily oscillating mode. In addition or alternative, the deformation of the membrane is conditioned, at a second frequency higher (or lower, in some examples) than the first frequency, by a piston mode in which the mass elements oscillate prevalently translatorily.

According to an aspect, each mass element has a shape elongated along a protrusion direction which is transversal to a planar cross section of the mass element. The elongation of each mass element along the protrusion direction is larger than the elongation(s) of each mass element in the planar directions.

According to an aspect, the plurality of mass elements includes at least one off-centered mass element. In some cases there are at least two off-centered mass elements, and in some other cases there are at least three off-centered mass elements, e.g. four off-centered mass elements, or more. When there are more than two off-centered mass elements, in some aspects they may be displaced in such a way to replicate the shape, or even the symmetry of the membrane border.

According to an aspect, at least one downscaled version of the border shape encounters, with a tolerance of 5%, 10%, 20%, or 30%, at least one off-centered mass element. Accordingly, the mutual displacement of the mass elements mimics the shape of the membrane, therefore reliably supporting the compensation of the tiling modes.

According to an aspect, positions equidistant from the membrane border and the membrane's center are occupied by at least one off-centered mass element, with a tolerance of 5%, 10%, 20%, or 30%. Accordingly, the mass elements are displaced in such a way that they are placed in analogous positions of the membrane, therefore reliably supporting the compensation of the tiling modes.

According to an aspect, at least one off-centered mass element is placed in such a way that a plurality of positions, which within a tolerance of 5%, 10%, 20%, or 30% are symmetrical with respect to at least one symmetry axis extending along a planar extension of the membrane and intersecting the border shape in at least two intersection positions, are occupied by at least one off-centered mass element. By following the symmetry of the membrane's border, the tilting compensation is further increased.

In some aspects, no mass element is positioned at a centered position of the membrane, but only mass elements are provided in off-centered positions.

According to an aspect, there is provide a sensor device comprising a semiconductor device as above or below, further comprising:

analog-to-digital circuitry to convert the electric signal indicative of the deformation of the membrane onto a digital version; and at least one digital measurer to obtain, from the digital version of the electric signal, a measurement of at least one pressure, vibration, and acceleration.

The sensor device, which may be, or be part of, a voice pickup unit (VPU), for example, may also include a plurality of semiconductor devices (e.g., as above) with different displacements, weights, shapes, of the mass elements (e.g., each of them being particularly sensitive to a particular acceleration range, vibration range, or pressure range, so that a plurality of different electric signals are obtained simultaneously, and the acceleration, vibration, or pressure is measured with increased precision through signal processing involving the different electric signals obtained simultaneously. In some cases, a device without mass element may be used (e.g., a conventional microphone) in combination with at least one or more semiconductor device(s) as above or below.

A method for manufacturing a semiconductor device (e.g., as above or below) and/or a sensor device (e.g., as above or below), the method including:

making a deformable membrane and a plurality of mass elements including at least two mass elements integral with, or fixed or mechanically connected to, the membrane, in such a way that the membrane has a membrane border held by a structure; and making at least one electric contact for connection to the membrane so as to acquire an electric signal indicative of the deformation of the membrane conditioned by the movement of the at least two mass elements.

4

Figures 2A, 2B, 2C:
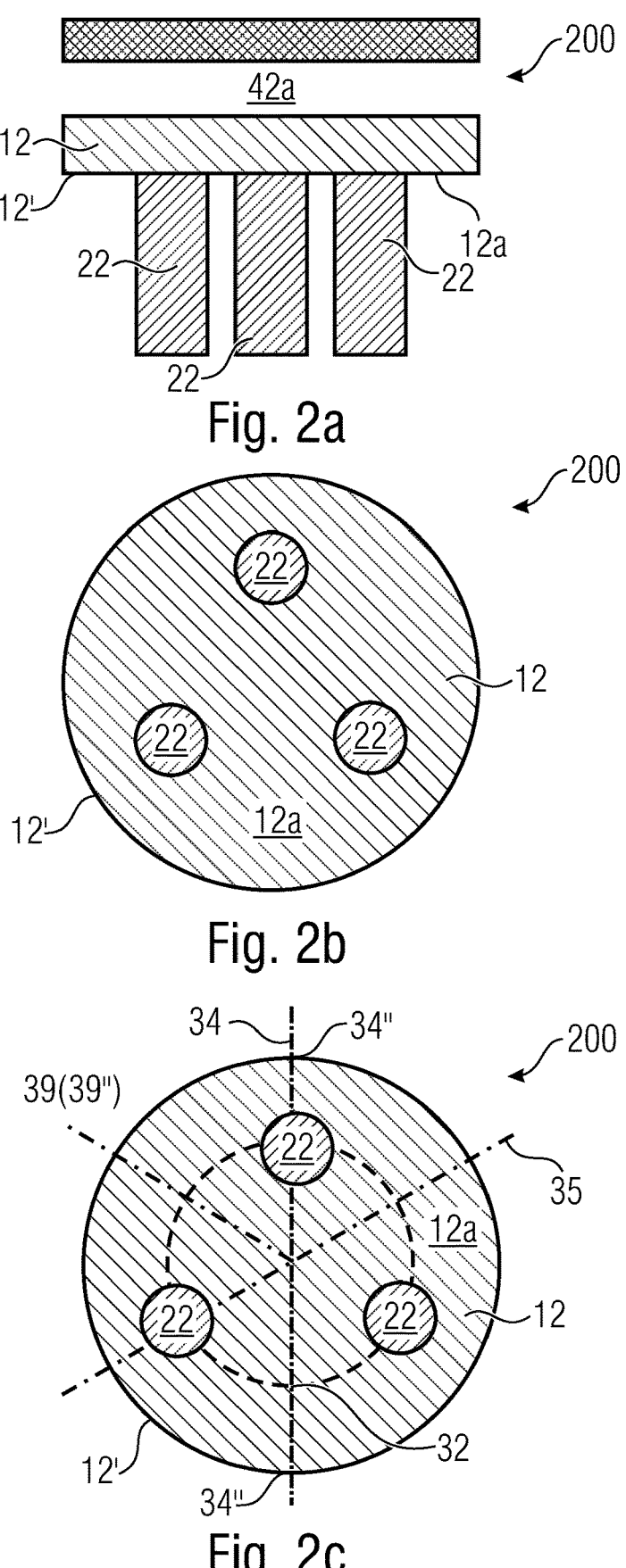
FIG. 2a shows an example of semiconductor device as seen according to a protrusion direction.
Figure 3A:
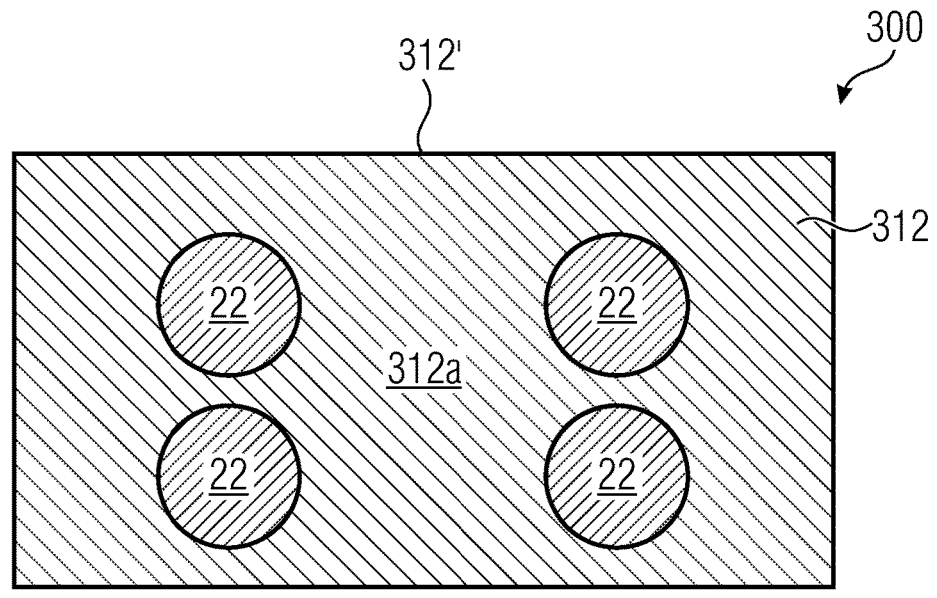
Figure 3B:
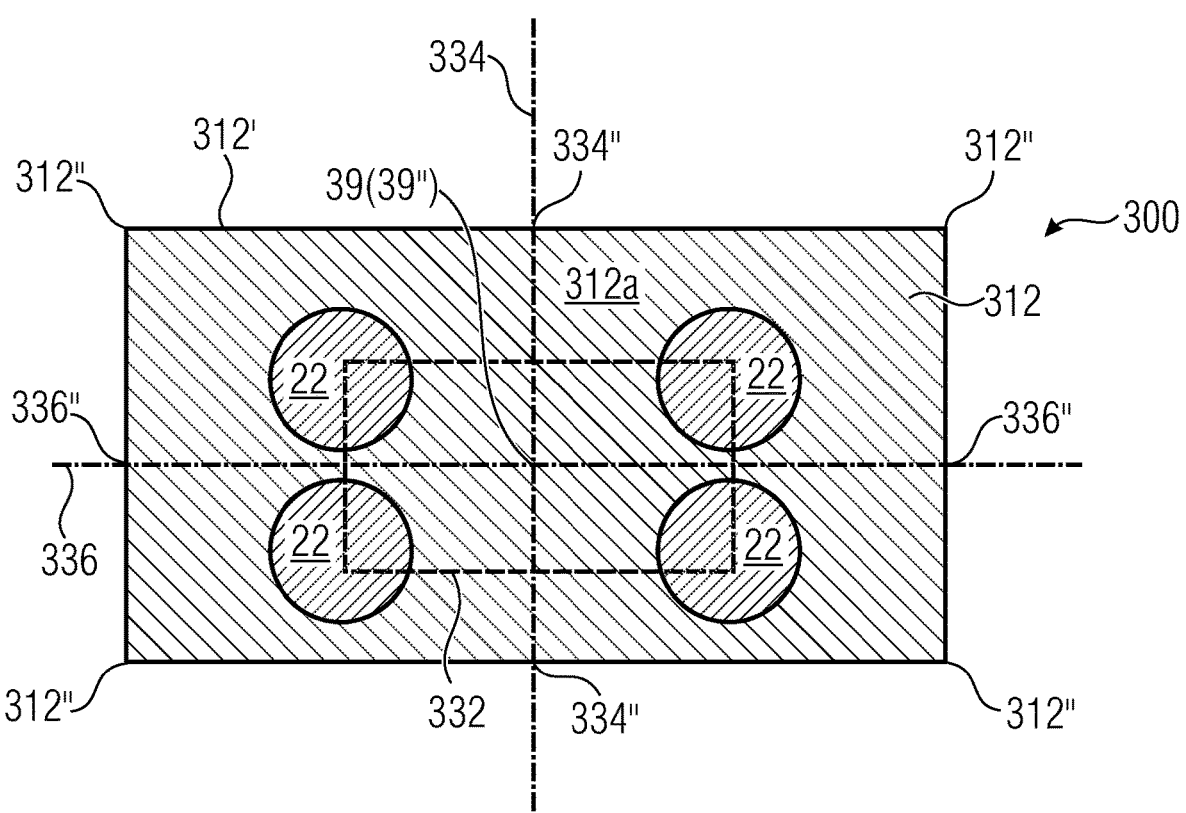
Figure 5A:
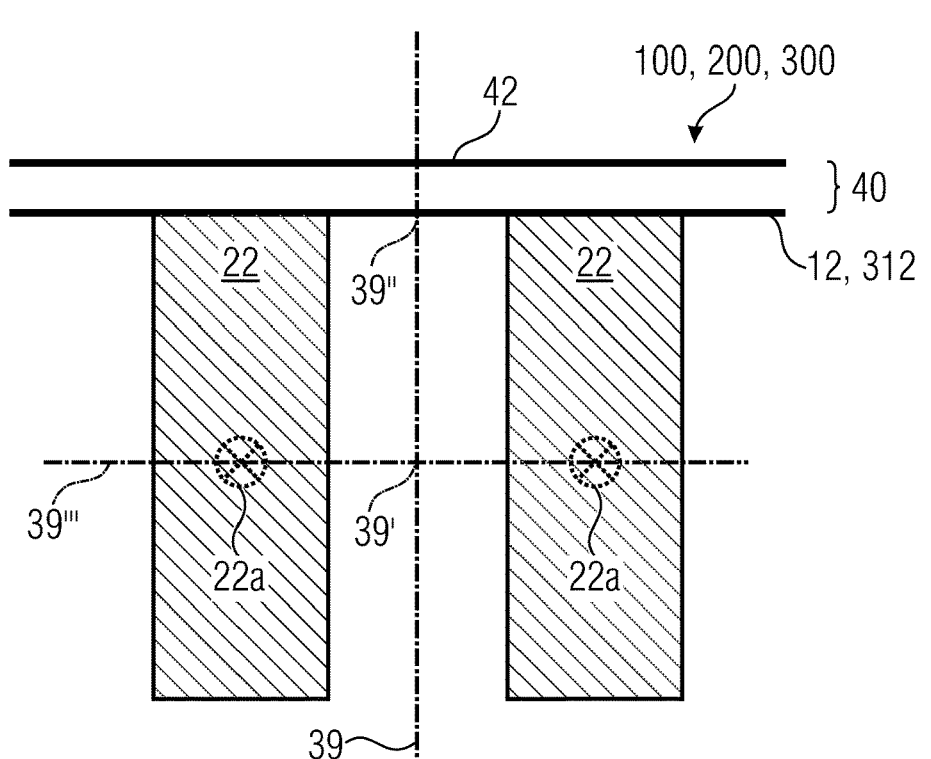
Figure 5B:
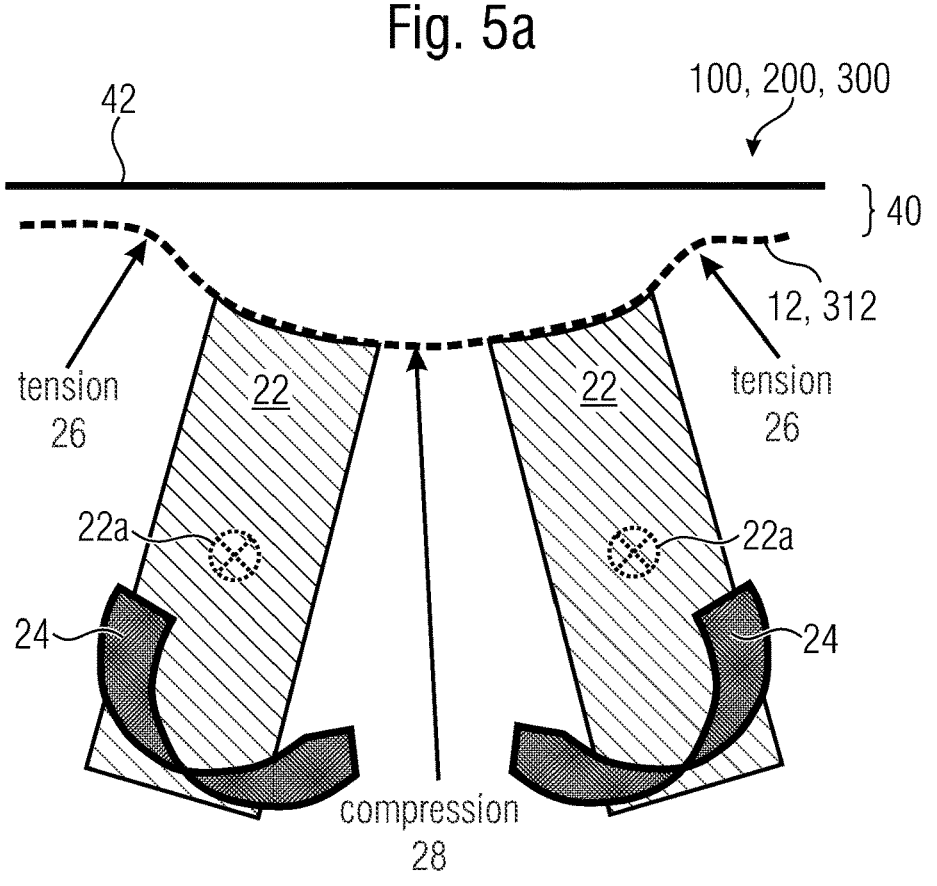
Figure 6:
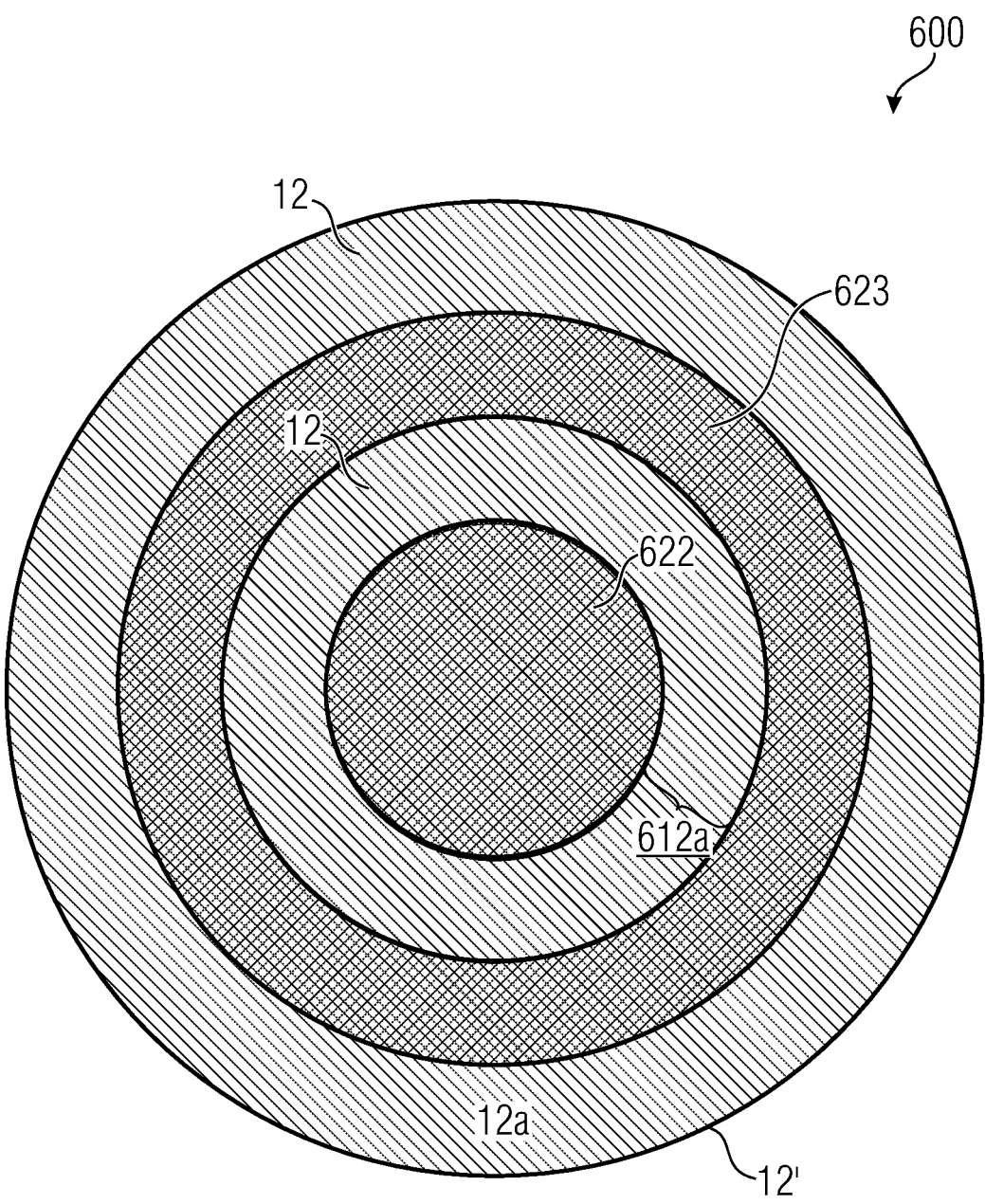
Figure 7:
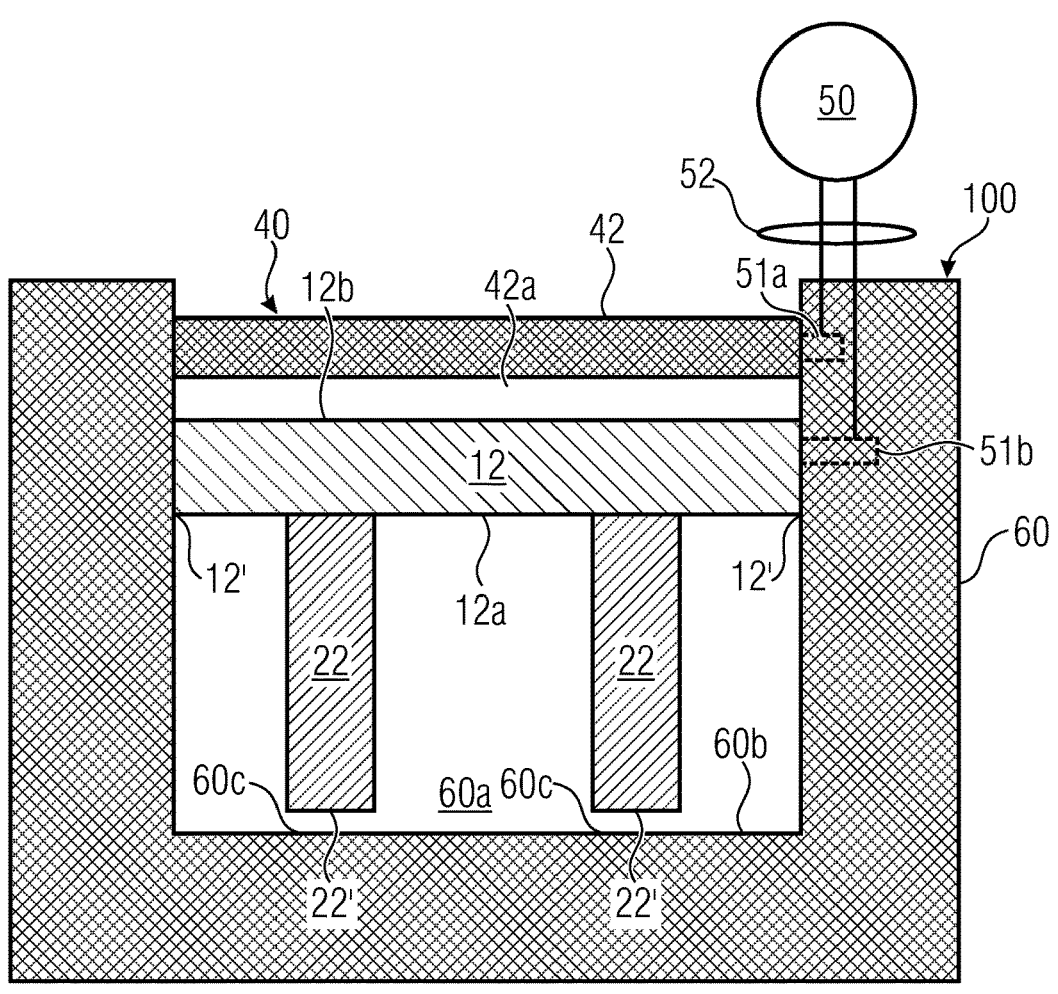
Figure 8:
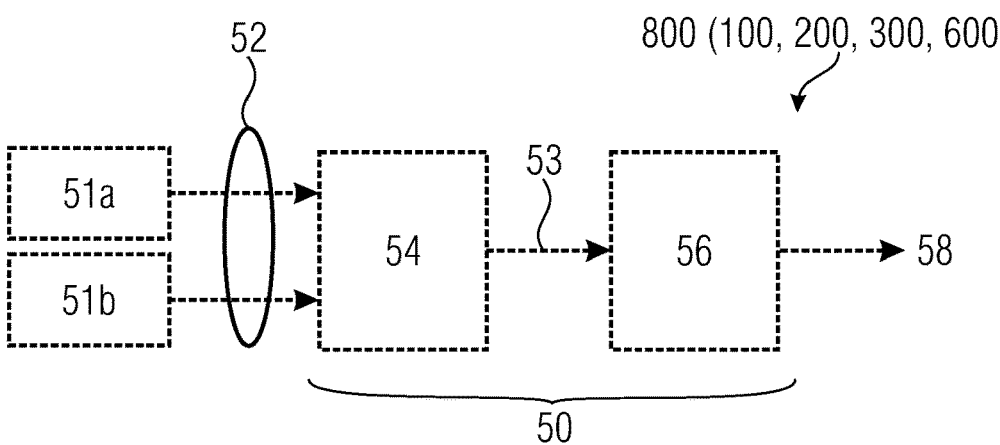

FIGS. 2b and 2c show the example of FIG. 2a as seen according to a planar direction;

FIGS. 3a and 3b show an example of semiconductor device as seen according to a planar direction;

FIGS. 4a and 4b show an operation of a conventional example as seen according to a protrusion direction;

FIGS. 5a and 5b show an operation of a conventional example as seen according to a protrusion direction;

FIG. 6 shows an example of semiconductor device as seen according to a planar direction;

FIG. 7 shows an example of semiconductor device as seen according to a protrusion direction; and FIG. 8 shows an example of sensor device which may include any of the devices of FIGS. 1a-3b and 5a-7.

DETAILED DESCRIPTION OF ILLUSTRATIVE EMBODIMENTS

Figure 1A:
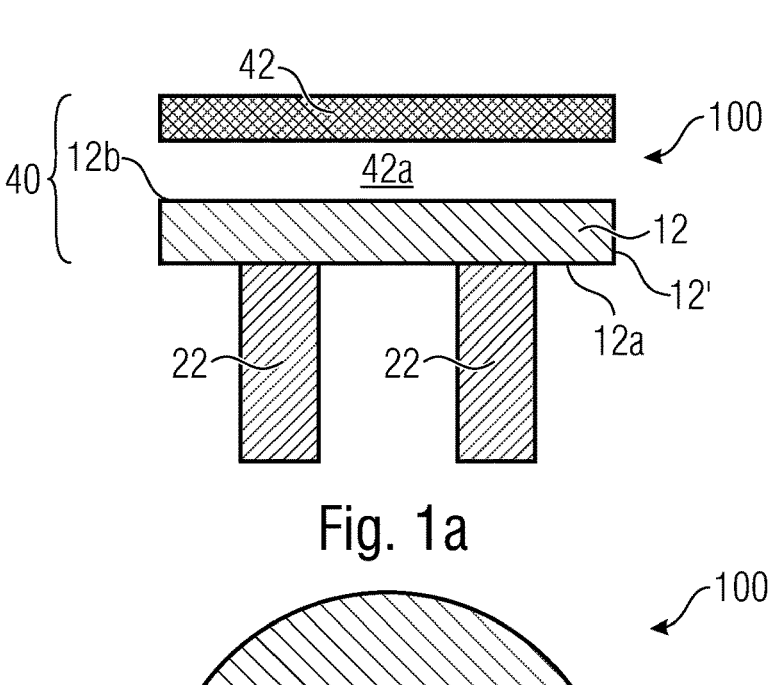
FIG. 1a shows an example of semiconductor device as seen according to a protrusion direction.

FIGS. 1a, 1b, 1c and 7 show a semiconductor device 100 which may be a MEMS device. The semiconductor device 100 may be (or be part of) part of a voice pickup unit. The semiconductor device 100, in this case, operates as a capacitor with variable capacitance (it will be shown that there is the possibility of implementing the examples by operating a semiconductor device according to different techniques, e.g. piezoelectric, resistive, etc.). The semiconductor device 100 may have a deformable membrane 12, subjected to deformation. The deformable membrane 12 may have a membrane border 12' (which is circular in this example, but could have another shape, e.g., polygonal, such as rectangular, e.g. squared, etc.). The semiconductor device 100 may have (or be attached to, to fixed to) a structure 60 (e.g., a chip structure or a part of a chip structure) which may hold the deformable membrane 12 in correspondence of the membrane border 12'. The membrane 12 may be secured to the structure 60 which, therefore, may operate as a holder. The semiconductor device 100 may include at least one electric conductor (e.g., two conductors 51a, 51b, see FIG. 7), to acquire an electric signal 52 indicative of the deformation (e.g., displacement) of the membrane 12. The semiconductor device 100 may include a plurality of mass elements 22 (in this present case four mass elements 22) suspended from the membrane 12. The mass elements 22 may operate as inertial masses, which provide a particular inertia to the membrane 12 (the particular inertia may be associated to a particular acceleration, vibration, or pressure to be sensed). The structure 60 may form a chamber 60a, e.g. closed by the membrane 12. As shown in FIGS. 1a and 7, the membrane 12 may have a first (internal) side 12a and a second (external) side 12b which are opposite with each other along the protrusion direction. The second (external) side 12b may be the side onto which the pressure to be measured is exerted, or in any case which is more exposed to the external environment. The first (internal) side 12a of the membrane 12 is the one from which the mass elements 22 are suspended (e.g., attached, fixed or integral thereto), and, in the case of the capacitive operation, it is the side opposite to the side 12b at the air gap of the capacitor. While in some examples the mechanical connection between the mass elements and the membrane is rigid (e.g., when they are integral in one piece or when they are glued), in some other cases other kinds of mechanical connection may be present; for example, a mechanical connection obtained through springs between the mass elements and the membrane may be present.

The semiconductor device 100 may operate as (or being part of) a vibration sensor, or acceleration sensor, or pressure sensor (see sensor device 800 in FIG. 8, for example). The semiconductor device 100 may obtain a particular electric signal 52 associated with the experienced vibration (or acceleration or pressure) in a particular range characteristic of the membrane 12 (the electric signal 52, or a processed version thereof, will then be read out, e.g. by a measurer, e.g. downstream to an analog-to-digital circuitry). The semiconductor device 100 may be associated, e.g. in the same structure 60 (e.g., in the same chip) with a multiplicity of other semiconductor devices, each having a membrane (which may be similar to the membrane 12), and all the semiconductor devices can operate synchronously, e.g. by sensing a vibration, an acceleration, or a pressure, simultaneously (e.g., in such a way that different semiconductor devices are sensitive to different ranges of acceleration, vibration, pressure). Different membranes of different semiconductor devices in the same structure 60 (e.g., same chip) may have the same shape, or different shapes. Different membranes of different semiconductor devices in the same structure 60 (e.g., same chip) may have different numbers of mass elements, or the same number of mass elements. Different membranes of different semiconductor devices in the same structure 60 (e.g., same chip) may have different weights of the mass elements, or the same weights. Different membranes of different semiconductor devices in the same structure 60 (e.g., same chip) may have different volumes of the mass elements, even if they have the same weight. Combinations are possible. For example, in the same structure 60 (e.g., same chip) there may coexist multiple semiconductor devices with different combinations of shape of the membrane, number and weight and volume of mass elements, etc. Different membranes of different semiconductor devices in the same structure 60 (e.g., same chip) may therefore be simultaneously subjected to different displacements even if they experience the same vibration (or acceleration or pressure). Therefore, each different semiconductor device among the multiplicity of semiconductor devices in the same sensor device may be susceptible to (or particularly sensitive to) a different ranges of vibration, acceleration or pressure. It is also possible that the same sensor device that hosts the semiconductor device 100 as shown in FIGS. 1a, 1b, 1c and 7 also comprises different semiconductor device(s) (e.g., at least one microphone or another semiconductor device which is not like the semiconductor device 100 of FIGS. 1a, 1b, 1c and 7; for example, it may lack a mass element, operating such as a traditional microphone). The semiconductor device 100 (or the sensor device comprising the semiconductor device 100) may be used, in particular, for a voice pickup unit (VPU) for picking up vibration signals from bone during speech (which may be an example of the sensor device). The semiconductor device 100 may be used for sensing inertial forces.

In the present example the semiconductor device 100 comprises a capacitor 40 with variable capacitance. The semiconductor device may be of the single backplate type. The capacitor 40 has a first electrode (which is, or is part of, or comprises the membrane 12) and a second electrode 42 (which in this case is considered to be fixed and non-displaceable (it does not deform with vibration, acceleration or pressure). The deformable membrane 12 is therefore completely in conductive material, or has at least one conductive layer (e.g., metal or highly-doped semiconductor material). The capacitor 40 formed by the membrane 12 and the second electrode 42 therefore has a dielectric gap 42a therebetween. The gap's elongation is modified in consequence of the membrane's deformation (e.g., displacement), and is therefore associated with the vibration, acceleration, or pressure to which the membrane 12 is subjected. The modification of the elongation of the dielectric gap 42a accordingly causes a variation of the capacitance of the capacitor 40. The electric signal 52 is therefore subjected to the instantaneous variation of the capacitance of the capacitor 40 and, therefore, also provides information on the vibration, acceleration, or pressure to which the membrane 12 is instantaneously subjected. The electric signal 52 is therefore indicative of the pressure, acceleration, or vibration acting on the membrane 12. In particular when operating for sensing a pressure, the second electrode 42 may have at last one through hole (not shown) to permit the pressure (e.g., sound) to arrive at least at the second side 12b of the membrane 12. It is intended that the second elected 42 may be (or at least have a layer) made of conductor material (e.g., metal, or highly doped semiconductor material).

The present examples may also be applied to the case in which the semiconductor device 100 is not capacitive, but, still, the electric signal 52 provides information on the vibration, acceleration, pressure.

For example, if the semiconductor device 100 is of the piezoelectric type, then the membrane 12 is a piezoelectric membrane in a piezoelectric material, and is electrically connected to the electric conductors. The piezoelectric membrane causes the variation of the electrical signal 52. The electric conductors may be, in that case, applied to in different sides (e.g., counterpoised with each other) of the piezoelectric membrane 12: for example, the conductor 51a could be connected to the second, external side 12b, and conductor 51b could be connected to the first, internal side 12a of the piezoelectric membrane. In the case of piezoelectric membrane, then the element 42 of FIG. 1a is not present.

In some cases, instead of using a capacitive technique or a piezoelectric technique, a resistive technique may be used. For example, the electric signal 52 may be subjected to the resistance of the membrane 12 (which here operates as a resistor with variable resistance). The resistance of the membrane 12 varies with the deformation (e.g., if the shape of the membrane is more arcuate, then the resistance is increased, and, and if the shape is more linear, then the resistance is decreased). In this case, the membrane, which is in resistive material (e.g., doped semiconductor material or resistive metal) will be subjected to a measurement through the conductors 51a and 51b in different portions thereof (e.g., in two different portions of the membrane border 12'). The electrode 42 is in this case not necessary.

It is in general imagined that the properties of the membrane 12 which are here discussed (and include the properties of the mass elements 22 and all the other mass elements discussed below) are considered to operate the same as a semiconductor device whether it is capacitive, piezoelectric, or resistive.

Figure 1B:
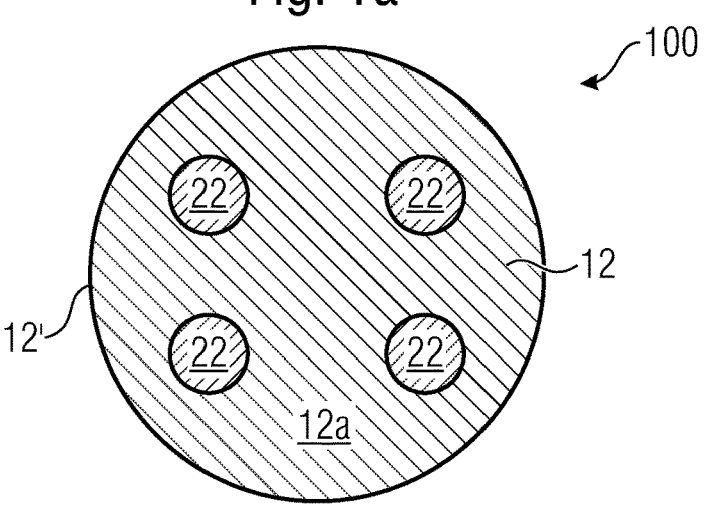
FIGS. 1b and 1c show the example of FIG. 1a as seen according to a planar direction.
Figure 1C:
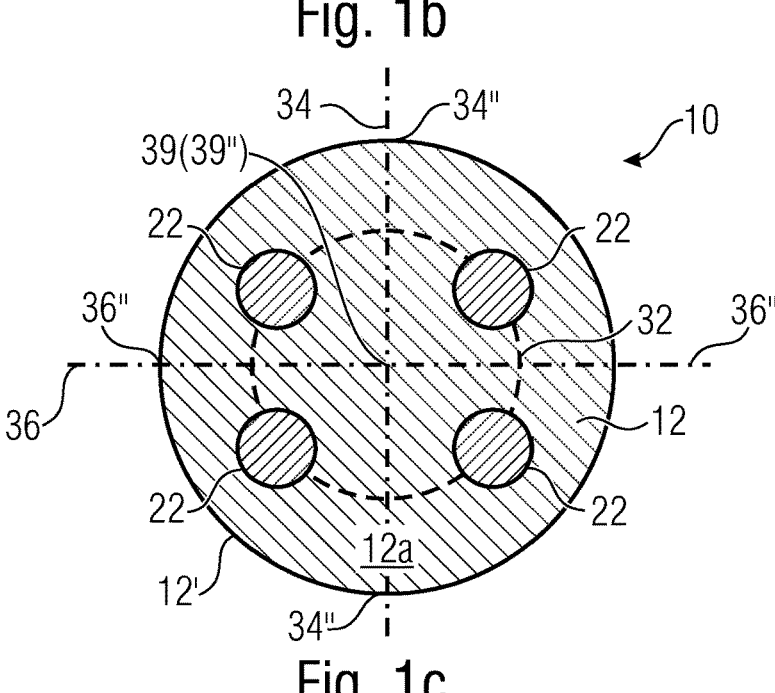

The membrane 12 may have a planar extension which is shown, for example, in FIGS. 1b and 1c. FIGS. 1b and 1c in particular show the membrane border 12' which is perimetrally or circumferentially extended in planar directions (e.g., horizontal and vertical in FIGS. 1b and 1c). FIG. 1a shows the view in a so called protrusion direction (the protrusion direction being vertical in FIG. 1a, the horizontal direction of FIG. 1a being a planar direction). The protrusion direction is the direction along which the mass elements 22 mostly extend.

It is in general intended that the pressures, vibrations, and/or accelerations to be measured act along the protrusion direction, the protrusion direction being transversal (e.g., perpendicular) to the planar extension of the membrane 12.

From the first (internal) side 12*a*, the mass element 22 may protrude (be projected) along the protrusion direction. In the particular example of FIGS. 1*a*, 1*b*, and 1*c*, the membrane 12 is cylindrical, e.g. disc-shaped (with diameter much larger than the height, e.g. at least five or ten times larger), and, in the planar direction (e.g., when seen from the side 12*a*), is circular (the membrane border 12' is circumferential). In that example, the mass elements 22 are four in number. The mass elements 22 may have the same dimensions with each other and/or the same weight and may be placed in symmetrical positions with respect to each other, as shown in particular in FIG. 1*c*: the four mass elements 22 are both displaced according to a radial symmetry (e.g., following the radial symmetry implied by the circular shape of the membrane side 12*a*) and also according to at least two symmetry axes (the symmetry axis 34 which intersects the membrane border 12' in intersection points 34" and 34"; and the symmetry axis 36 which intersects the membrane border 12' in intersection points 36" and 36"). In this case, all the mass elements 22 are off-centered.

FIGS. 2*a*, 2*b*, and 2*c* show another example of a semiconductor device 200 which is almost the same of the semiconductor device 100 of FIGS. 1*a*, 1*b*, 1*c* and 7. The only main difference is that in this case there are three mass elements 22 instead of four. Even in this case, the semiconductor device 200 can be either capacitive, piezoelectric, or resistive, and all the discussion regarding the axes, the planar extension, the membrane border, the sizes, are valid, even though not repeated intersection. It is notwithstanding to notice that, also in this case, the membrane border 12' is circumferential (the membrane side 12*a* is circular, and the membrane 12 is cylindrical, e.g. disc-shaped) and symmetries (e.g., the radio symmetries but also axis symmetries) are also present, even though with axes 34 and 35 (which is different from axis 36 in FIG. 1*c*). The three mass elements 22 are off-centered (in this particular case they are displaced to form an equilateral triangle).

According to other examples, there could be other displacements with different numbers of mass elements 22. For example, by maintaining the circular shape of the membrane side 12*a*, there could be for example five mass elements 22 (e.g., they could be displaced in a shape of a pentagon, such as a regular pentagon). Or, there could be six mass elements 22 (and they could be shaped in a hexagon, such as a regular hexagon). The same could be for seven (e.g., by describing a heptagon, such as a regular heptagon), eight (by describing an octagon, such as a regular octagon) and so on.

FIGS. 3*a* and 3*b* show (in a planar view analogous to the views of FIGS. 1*b*, 1*c*, 2*b*, 2*c*) another example of a semiconductor device 300 for which are also valid the same features discussed above (and not repeated for brevity), a part for those which are implied by the rectangular shape vs circular shape. The membrane 312 is parallelepiped-shaped (e.g., rectangular in planar view, and having a height, or thickness, which is much less than the dimensions of the rectangle in planar view, e.g. more than five times or ten times or twenty times smaller than the dimensions of the rectangle in planar view). The membrane 312 has a rectangular border (perimeter) 312', with four vertices 312". Four mass elements 22 may protrude from the first (internal) side 312*a* of the membrane 312 as shown in FIG. 3*b*. The four mass elements 22 may be displaced according to both a radial symmetry and at least two axial symmetries along the axes 334 (intersecting the membrane border 312' at intersection points 334") and 334" and 336 (intersecting the membrane border 312' at intersection points 336" and 336"). The four mass elements 22 may be therefore displaced according to a rectangle (a reduced shape of the border 312'), each mass element 22 being at vertex of the rectangle (hence resembling the rectangular shape of the membrane side 312*a*). It is also to be noted that each mass element 22 may be equidistant from a relative vertex 312" of the membrane border 312'. As can be seen, in the semiconductor device 300 the mass elements 22 are off-centered.

FIG. 6 shows another example of a semiconductor device 600 which also can be either capacitive, piezoelectric, or resistive. FIG. 6 is analogous to FIGS. 1*b*, 1*c*, 2*b*, 3*a*, and 3*b* and shows a view of the planar extension of the membrane 12 from the first, internal side 12*a*. However, in this case there is a first mass element 622 in centered position, while there is an off-centered, but (in this case) concentric, second mass element 623. The first mass element 622 in centered position and the off-centered second mass element 623 may be interspaced through an intermediate membrane portion 612*a* of the first internal side 12*a* of the membrane 12*a*. The masses (weights) of the mass elements 622 and 623 may be in this case the same, but they can also be different from each other. The mass elements 622 and 623 may be both centered on the center of the membrane 12 (as seen in the planar extension). In the case of FIG. 6, the first mass element 622 in centered position may be subjected to a tiling mode, but this is compensated by the off-centered second mass element 623, which in turn is subjected to a compensating counter-tilting mode. We have understood that the membrane movement is piston-like (and therefore translatorily oscillating) at least in the intermediate membrane portion 612*a* of the first internal side 12*a* of the membrane 12*a* between the first mass element 622 in centered position and the off-centered second mass element 623.

In general terms, the positions of the mass elements (either 22 or 622 and 623) may be chosen in such a way that the center of mass (barycenter) of the group of mass elements (collectively considered) is in centered position of the membrane 12 or 312. The centered position is in the planar extension of the membrane 12 or 312 is so that, if we look in the protrusion direction like in FIG. 1*a*, the center of mass (barycenter) actually fall out of the volume of the membrane 12 or 312, but it is still in an axis passing through the center of the membrane 12 or 312. Reference will also be made it FIG. 5*a*, which shows the position 39' of the center of mass (barycenter) of the group of four mass elements 22 as being in central axis 39 passing though the center 39" of the membrane 12. The same is shown in FIG. 1*c*, because the center of mass of the group four mass elements 22 taken collectively is in the central position 39" of the membrane 12, as well as in FIGS. 2*c* and 3*b*.

In examples as above, at least two (and in particular at least three, e.g. four, five, six, eight, etc.) off-centered mass elements may result to be placed at positions which are inscribed in at least one downscaled version 32 (FIG. 1*c*, 2*c*) or 332 (FIG. 3*b*) of the border shape 12' or 312'. The membrane border 12' (or 312') has a polygonal or circumferential border shape, e.g. having a number (e.g., four) of vertices 312" in the case of the polygonal shape, and the displacement of the mass elements 22 may replicate the polygonal shape. If the shape of the membrane in the planar direction is circular (e.g., like the shape of the membrane 12) or curve (e.g., elliptical), then at least two or at least three (e.g., four, five, six, eight, etc.) off-centered mass elements 22 may be positioned in positions which are inscribed in a reduced version of the (circular or curve, e.g. elliptical) membrane border of the membrane, the reduced version of the membrane border being also centered in the same center of the membrane 12 (in some cases in which the membrane has an elliptical shape, the major axis and the minor axis of the membrane can be the same major axis and minor axis of the reduced version of the membrane passing through the off-centered mass elements). As shown in FIG. 3b, the mass elements 22 may be (or comprise) vertex-corresponding off-centered mass elements 22, e.g. in the same number of the vertices 312", in such a way that the vertex-corresponding (and off-centered) mass elements 22 are equidistant from the corresponding vertices 312" of the membrane 312. In some examples (e.g., in FIGS. 1a-3b and 7), at least two or at least three (e.g., four, five, six, eight, etc.) off-centered mass elements 22 may be displaced in a polygonal fashion (e.g., similarly to the shape of the membrane border 12' or 312'), e.g. so that the position of each mass element 22 is the vertex of a regular polygon or at least of a reduced polygon having equal angles of the polygonal shape of the membrane border (e.g., 312') (and the polygonal shape of the membrane border and the reduced polygon may be equi-centered, for example). At least two or at least three (e.g., four, five, six, eight, etc.) off-centered mass elements 22 or 622 or 623 may be placed at positions which are equidistant from the membrane border 12', 312' and/or from the vertexes 312" of the membrane 12, 312 (see FIGS. 1a-3b). At least two (but in particular three, e.g. four, five, six, eight, etc.) off-centered mass elements 22 may be placed at positions which are equidistant from the center of the membrane 12, 312'.

It is possible to state, in general, that at least one downscaled version (32, 332) of the border shape (12') may encounter at least one off-centered mass element (22, 623). In addition or alternative, positions equidistant from the membrane border (12', 312') and the membrane's center may be occupied by at least one off-centered mass element (22, 623). In addition or alternative, the at least one off-centered mass element (22, 623) may be placed in such a way that a plurality of positions, which are symmetrical with respect to at least one symmetry axis (34, 36, 334, 336) extending along a planar extension of the membrane (12, 312) and intersecting the border shape (12', 312') in at least two intersection positions (32", 34", 332", 334"), may be occupied by at least one off-centered mass element (22, 623).

In some examples, at least two (e.g., three, four, five, six, eight . . . ) off-centered mass elements 22 may be placed at positions which may be symmetrical with respect to at least one or two symmetry axes (e.g., 34, 35, 36, 334, 336) extending along a planar extension of the membrane 12, 312 and intersecting the border shape (e.g., 12', 312') in at least two intersection positions (e.g., 32", 34", 332", 334"), as shown in FIGS. 1c, 20, 3b (but it is also valid in FIG. 6). In the cases of FIGS. 1a-3b, the two symmetry axes (e.g., 34, 36, 334, and 336) may be perpendicular with each other; in the example of FIG. 2c, the two symmetry axes 34 and 35 are non-perpendicular. In some examples, the symmetry axes according to which the symmetry axes (e.g., 34, 35, 36, 334, 336) according to which the mass elements 22 are positioned are also symmetry axes of the membrane side (12a, 312a). Indeed, in FIG. 1c the mass elements 22 are symmetrically displaced with respect to both symmetry axes 34 and 36, which are also symmetry axes of the membrane side 12a (since axes 34 and 36 divide the membrane side 12a in two semicircular halves). In FIG. 2c, the mass elements 22 are symmetrically displaced with respect to both symmetry axes 34 and 35, which are also symmetry axes of the membrane 12 (since axes 34 and 35 divide the membrane side 12a in two semicircular halves). In FIG. 3b, the mass elements 22 are symmetrically displaced with respect to both symmetry axes 334 and 336, which are also symmetry axes of the membrane side 312a (since axes 334 and 336 divide the membrane side 312 in two semicircular halves). It may be understood that the symmetry of the membrane side 12a or 312a is replicated by the symmetry of the displacement of the mass elements 22 (e.g., symmetry axes of the membrane side 12a or 312a are also symmetry axes of the polygonal displacement of the mass elements 22 or 622 or 623). For example, the symmetry in the shape of the membrane 12 or 312 (which is a continuous body), and in particular of the membrane side 12a or 312a, is replicated by the symmetry in the displacement of the mass elements (which, in FIGS. 1a-3b, are discrete elements).

In examples above, the mass elements 22 fixed to the same membrane 12, 312 may be mostly understood as having the same shape, even if the shape, can, in some cases, vary for different semiconductor devices of the same sensor device 800. It is in general possible to have the mass elements 22 having the same density and/or the same mass. It may be preferable that all the centers of mass of the mass elements 22 (the center of mass of each mass element) are coplanar. This is also shown in FIG. 5a, because the centers of mass 22a of the different mass elements 22 are in the same plane 39" (which is also parallel to the planar extension, and to the side 12b, 312b of the membrane 12, 312).

In some cases, the membrane 12 (or 312) may be in the same material of (and being integral in one piece with) the mass elements 12 (or 622, 623). (e.g., they are in the same plane, parallel to the planar extension of the membrane 12, 312). In particular, the mass elements (in particular the mass elements 22) may have the same elongation with each other in the protrusion direction (vertical direction in FIGS. 1a, 2a, 5a, 5b) and may have the same thickness with each other in the planar extension (e.g., in FIG. 1b, 1c, 20, 3a, 3b they are cylinders with the same circumferential area). In FIG. 6, the mass elements 622 and 623 have different shape, but, notwithstanding, they may have the same position of the respective centers of mass when seen in the planar direction (i.e., they may be non-coincident, but they are in the same central axis 39 elongated in the protrusion direction).

As shown in FIG. 7, the mass elements 22 may be internal to a chamber 60a defined by internal walls of the structure 60 and the first, internal side 12a of the membrane 12 (the same can apply to the device 300 or 600). The mass elements 22, 622, 623 may extend along the protrusion direction (vertical in FIG. 7) for an amount which is less than the extension of the chamber 60a in the protrusion direction, thereby defining a gap 60c between a free extremity 22' of the mass element 22 (or 622, 623) and the surface 60b (e.g., the floor surface) of the chamber 60a. Accordingly, the mass elements 22 do not touch the surface 60b.

Operations of the present examples with respect to conventional examples are now discussed by comparing the operations of the semiconductor device 100, 200, 300 (but also the semiconductor device 600 could be used) with a conventional semiconductor device 500 shown in FIGS. 4a and 4b. In the present examples (e.g., 100, 200, 300, 600), the elements 12 or 312 (membrane) and 42 (the other electrode of the capacitor 40) are shown as lines for simplicity (element 42 is in general avoided in the case of piezoelectric or resistive sensing technique). As shown in FIG. 4a, in a conventional semiconductor device 500 only one single mass element 522 is present and is positioned in centered position of the membrane 512. The mass element 522 of the conventional semiconductor device 500 has a center of mass (barycenter) 522a which is centered with the membrane 512 (the membrane's center is vertically above the center of mass 522a, i.e. the axis 539, elongated along the protrusion direction, passes through both the center of mass 522*a* and the center of the membrane 512). When the membrane 512 starts vibrating (e.g. by effect of an external vibration, an acceleration, a pressure), the membrane 522 also starts to be deformed and the mass element 522 moves. While it would be preferable to have the movement of the mass element 522 to be perfectly translatory (in the sense that it would be preferable that the center of mass 522*a* of the mass element 522 would move only along the axis 539, i.e. along the protrusion direction), this is often not reached. In fact, there is often experienced an unwanted component of vibration transversal to the axis 539 and the center of mass 522*a* also oscillates out of the axis 539. Accordingly, the orientation of the mass elements 522 may vary during an oscillation, i.e. is subjected to a tilting mode 524. The tilting mode 524 inserts an unwanted noise, which is present in the electric signal 52 describing the vibration. We see in FIG. 4*b* for example that in one region of the membrane 512 is subjected to a tension 526, while another region is subjected to a compression 528. This appears during a first semi period of the vibration: during a subsequent semi period, the region which was subjected to the tension 526 is subjected to a compression, and the region which was subjected to the compression 528 is subjected to a tension. Basically, the tilting mode 524 results a stable (low-energy) oscillation mode and cannot be easily avoided with the implementation shown in FIGS. 4*a* and 4*b*. On the other side, it is difficult to filter the unwanted noise at the electric signal.

However, with the present examples (e.g., 100, 200, 300, 600, etc.), tilting modes affecting each mass element (22, 622, 623) are substantially compensated. As shown in FIG. 5*a*, the symmetrical position of the mass elements 22 (as discussed above) may permit to have, in FIG. 5*b*, a cancellation of the tilting modes for the global, collective group of mass elements 22. FIG. 5*a* shows that the center of mass (barycenter) of the global, collective group of mass elements 22 is co-centered with the center 39" of the membrane 12, 312 (the axis 39 along the protrusion direction passes through both the position 39' of the center of mass of the group of mass elements 22 and the center 39" of the membrane 12 or 312). As shown in FIG. 5*a*, the centers of mass 22*a* of each mass element 22 are coplanar to the plane 39''' extending in parallel to the membrane 12, 312 (e.g., in parallel to sides 12*a* and 12*b*). Therefore, the centers of mass 22*a* of each of the mass elements 22 have the same distance from the membrane 12, 312. Further, the resulting center of mass (taken collectively) for the group of mass elements 22 is in position 39', which is in central position when seen in the planar extension (see also position 39 in FIGS. 1*c*, 2*c*, and 3*b*).

As shown in FIG. 5*b*, each of the mass elements 22 results to be subjected to both a translatory, translatorily oscillating mode (with the respective center of mass 22*a* oscillating along the protrusion direction, in parallel to the axis 39), and a tilting mode 24. Notwithstanding, taking collectively, the tilting modes 24 of the mass elements 22 (or 622 and 623) compensate for each other. For example, in FIG. 5*b* the left mass element 22 tilts toward left while the right mass element 22 tilts toward right during a first semi period of its oscillation; subsequently, during the immediately subsequent semi period of the oscillation (not shown), the left mass element 22 will tilt towards the right, while the right mass element 22 will tilt towards the left. As can be seen in FIG. 5*b*, the membrane 12 (312) is deformed is such a way that its central region is subjected to a compression 28 while, simultaneously, external regions of the membrane 12 (closer to the membrane border 12') are subjected to tension 26. Notably, this applies to the semi period of the oscillation depicted by FIG. 5*b*: during the subsequent semi period of the oscillation (not shown), the central region will be subjected to a tension, while the external regions will be subjected to a compression. While the mass elements 22, taken singularly, are subjected to tilting modes 24, the center of mass of the group of mass elements 22 taken collectively does not move along the planar direction, but remains oscillating, in a translatorily oscillating mode, along the axis 39' (shown in FIG. 5*a*) passing through the center 39" of the membrane 12 (312). Therefore, the collective motion to which the group of mass elements 22 is subjected is a translatorily oscillating mode, and no tilt mode is experienced for the collective group of mass elements 22. The center of mass of the system of mass elements 22 taken collectively oscillates back and forth along the protrusion direction, but without deviating from the central axis 39 perpendicular to the membrane 12 (312). This translatorily oscillating mode results stable: if in FIG. 5*b* the right mass element 22 happens to tend to diverge more than the left mass element 22, then the inertia of the left mass element 22 and the compression 28 of the membrane 12 (312) will react, contrasting the tendency of the right mass element 22 to move towards right (thereby keeping the right mass element 22 in its tilting mode 24, specular to the tilting mode experienced by the left mass element). Therefore, not only do the tilting modes 24 of the different mass elements 22 compensate for each other, but also imply the stability to the translatorily oscillating mode of the collective system of mass elements 22. In view of the above, with the present examples the mass elements 22 (622, 623) are subjected to movements whose resultant involves a collective translatorily oscillating mode. In some examples, the center of mass of the plurality of mass elements 22 (622, 623) taken collectively is therefore positioned in centered position. In general terms, the membrane's deformation is conditioned be the movement of the plurality of mass elements 22 (622, 623) and in particular by the mutual compensation of the tilting modes 24.

The result does not change if we also consider, in the system of mass elements, also the membrane 12, 312: since the membrane 12, 312 has also its center of mass in the axis 39 (FIG. 5*a*), the resulting center of mass of the system comprising all the mass elements 22+the membrane 12 (312) remains in the axis 39.

With respect to the conventional examples, the present examples permit to have other advantages. In the example of FIGS. 5*a* and 5*b* the total mass of the whole group of mass elements 22 (or 622, 623) may be the same of the mass of the single mass element 522 of FIGS. 4*a* and 4*b*. As can be grasped by comparing FIGS. 5*a* and 5*b* with FIGS. 4*a* and 4*b*, with the present examples it is possible to reduce the diameter (or more in general the elongation in at least one of the planar directions) of the mass elements 22, 622, 623, but maintaining the same weight (and therefore the same vibration range, acceleration range, or pressure range). An advantage is that the mechanical stress exerted by each of the mass elements 22, 622, 623 onto the membrane 12, 312 is lower than the stress exerted by the single mass element 522 of the conventional example of FIGS. 4*a* and 4*b*: therefore, the use of multiple mass elements also permits to increase reliability. With respect to the conventional examples, the present examples may also permit to reduce the elongation of the mass elements 22 (622, 623) in the protrusion direction (e.g., the height of the cylinders), and also to diminish the length of the chamber 60*a* in the protrusion direction, thereby reducing the dimensions of the structure 60 (and of the chip) in the protrusion direction.

Some tolerances are (as in any mechanical system) possible. For example, a 30% maximum tolerance may be provided (i.e., distance can be changed of 30% of each absolute value). In some examples, however, in order to increase precision, a tolerance of maximum 20% may be used. In some examples, however, in order to increase precision, a tolerance of maximum 10% may be used. In some examples, however, in order to increase precision, a tolerance of maximum 5% may be used.

In the example of FIG. 6, may be seen, in some examples, as being substantially the same: if the external, off centered mass elements 623 oscillates according to a particular tilting mode, then the internal, centered, mass element 622 also oscillates in a way of compensating the tilting mode of the mass elements 623. Despite the example of FIG. 6, mass elements may also be (e.g., in the examples of FIGS. 1*a*-3*b* and 5) off-centered with respect to the center of the membrane 12 (312) and they may have a volume that is simply connected: i.e. it may have no holes inside. The shape of the mass elements 22 of FIGS. 1*a*-3*b* and 622 may be such that the internal angles between the outer surfaces are less than 90°, and may be therefore essentially convex figures (this does not apply to the mass element 623, which has an internal passing cavity inside which the mass element 622 is housed). All the mass elements 22 of FIGS. 1*a*-3*b* may be the same and made of the same material, therefore having the respective center of mass at the same distance from the membrane 12 as mentioned along the protrusion direction (vertical in FIGS. 1*a*, 2*a*, 4*a* and 5*a*).

In examples above reference is often made to "translatorily oscillating mode" which is the mode according to which the center of mass of the entire system of mass elements tends to oscillate along the protrusion direction. This may be obtained, as explained above, through a compensation between the tilting modes symmetrically affecting single mass elements. In some cases, at different frequency ranges different behaviors are possible, with different consequences on the modes. For example, at a first frequency tilting modes may be predominant, and at a second frequency piston modes may be predominant. Different frequencies may therefore imply different modes. Also the piston mode obtained e.g. at a second frequency is a translatorily oscillating mode, because also in this case the center of mass of the entire system of mass elements tends to oscillate along the protrusion direction. Hence:

at a first frequency (e.g., like in FIG. 5*b*), the deformation of the membrane (12, 312) may be conditioned by a compensation between the tilting modes singularly affecting the mass elements (22) generating a translatorily oscillating mode; and at a second frequency different from (higher than or lower than) the first frequency (not shown in the figures), the deformation of the membrane (12, 312) may be conditioned by a piston mode in which the mass elements (22) oscillate prevalently translatorily.

Even at the second (higher or lower) frequency, however, the increased reliability of the increased number of mass elements is advantageous over the reduced reliability of the conventional single mass element.

With the use of multiple mass elements, energy is taken away from the main oscillation mode, a lower resonance frequency can be obtained, thereby increasing the sensitivity.

In examples above, the membrane border 12', 312' at least one off-centered mass element 22, 623 is placed in such a way that a plurality of positions, which are symmetrical with respect to at least one symmetry axis 34, 36, 35, 334, 336 extending along a planar extension of the membrane 12, 312 and intersecting the border shape 12', 312' in at least two intersection positions 32", 34", 332", 334", are occupied by at least one off-centered mass element 22, 623. In examples above, a sensor device may include at least one of the semiconductor devices above (e.g., 100, 200, 300, and 600). In particular, a plurality of semiconductor devices like those above (e.g., 100, 200, 300, 600) may be provided, with membranes 12 (or 312) having mass elements 22 (or 622, 623, etc.) with different masses (and or positions) so as to be sensitive to different ranges of vibrations or accelerations or pressures. In examples, the at least one semiconductor devices as above (e.g., 100, 200, 300, 600) may also be operated together with a semiconductor device having no mass element (and having therefore the bare membrane), which may be used as microphone.

As shown in FIGS. 7 and 8, the semiconductor device 100, 200, 300, 600 (or a sensor device 800 including the semiconductor device 100, 200, 300, 600) may include further circuitry 50 which may, for example, implement application-specific integrated circuit (ASIC), or another micro-processor based system or another circuitry including at least one of:

analog-to-digital circuitry 54 to convert the electric signal 52 indicative of the deformation of the membrane 12, 312 onto a digital version 53; and at least one digital measurer 56 to obtain, from the digital version 53 of the electric signal 52, a measurement 57 of at least one pressure, vibration, and acceleration.

At least one amplifier may also be used, to amplify the signal 52.

The sensor device 800 may be, or be part of, a voice pickup unit (VPU). The sensor device 800 may include a plurality of semiconductor devices (e.g., as above, 100, 200, 300, 600, etc.) with different displacements, weights, shapes, of the mass elements 22, 622, 623 (e.g., each of them being particularly sensitive to a particular acceleration range, vibration range, or pressure range). Accordingly, a plurality of different electric signals 52 are obtained simultaneously, and the acceleration, vibration, or pressure is measured with increased precision through signal processing involving the different electric signals 52 obtained simultaneously. The signal processing may be performed by the digital measurer 56 on the digital versions 53 of the electric signals 52, for example. In some cases, a semiconductor device without mass element may be used (e.g., a conventional microphone) in combination with at least one or more semiconductor device(s) 100, 200, 300, 600. Also in that case, the digital signal obtain by the conventional microphone may be used to obtain the pursued measurement 58 of the acceleration, vibration, pressure, through signal processing (e.g., performed by the digital measurer 56) in combination with the electric signal(s) 52 obtained by the at least one or more semiconductor device(s) (e.g., 100, 200, 300, 600).

There is here also disclosed a method for manufacturing a semiconductor device e.g., as above (e.g., 100, 200, 300, 600, etc.). The method may include:

making a deformable membrane 12, 312 and mass elements (e.g., including at least one off-centered mass element) integral with, or fixed to, the membrane 12, 312, the membrane border 12', 312' being held by a structure 60; and making at least one electric contact 51*b* for connection to the membrane 12, 312 so as to acquire an electric signal 52 indicative of the deformation of the membrane 12, 312.

The mass elements 22 and the membrane 12, 312 may be obtained by etching a precursor block (e.g., of bulk semiconductor material). In this case, the interspace (e.g., 60c, or more in general the void portion of the chamber 60a in FIG. 7) between the membrane 12 and the mass elements 22 may be obtained by etching. In some examples, the membrane 12 or 312 may be of the same material (and being integral in one piece with) as the mass elements 22 or 622, 623, e.g. in semiconductor material (e.g., bulk material, e.g. non-doped material). However, in some cases, the membrane 12, 312 (or at least one portion thereof) may be doped, so as to permit the membrane 12, 312 to operate as electrode of the capacitor 40, or as a resistor. In some examples, the mass elements 22 may be first applied to the membrane 12, 312, e.g. by gluing, or wave-bonding, and subsequently the deformable membrane 12, 622, 623) may be applied to the structure 60 (e.g., from above). This may be the case of the piezoelectric example, because the membrane 12, 312 is in the piezoelectric material, which is not necessarily the same material used for the mass elements 22, 622, and 623. In some cases, also when the membrane 12, 312 is the electrode of the capacitor 40 and when it operates as a resistor, the mass elements 22, 622, 623 may be applied (e.g., fixed, glued, attached) to the membrane 12, 312, thereby resulting suspended from the membrane: in this case, the mass elements 22, 622, 623 may be in a material which is the same of or different from the material of the membrane 12, 312. In particular where the mass elements 22, 622, 623 are in a material which is different from the material of the membrane 12, 312, it may be that the material of the mass elements 22, 622, 623 is a non-conductive material (e.g., non-doped semiconductor material), while the material of the membrane 12, 312 is a conductive material or a highly doped semiconductive material (e.g., in the capacitive case), a resistive material or a doped semiconductive material (e.g., in the resistive case), or a piezoelectric material (e.g., in the piezoelectric case). In some examples the material of the membrane 12, 312 may be a composite material, e.g. made of a plurality of layers stacked together. For example, in the case of the capacitor, an external conductive (or highly-doped semiconductive material) layer may be applied to the external side 12b of the membrane 12, 312, thereby forming a capacitor (but the remaining part of the membrane 12, 312 may be of a semiconductive material): in this case, the membrane 12, 312 may be made integrally with the mass elements 22, 622, 623, and the layer on the external side 12b may be applied before etching or after etching (or before or after applying the membrane and mass elements onto the structure 60). In other case, spring elements may mechanically connect the mass elements 22, 622, 623 to the membrane 12, 312.

In examples above, the membrane 12, 312, may have a thickness (e.g., in the protrusion direction) between 200 nm (nanometers) and 600 μm (micrometers). The elongation of the mass elements 22, 622, 623 (e.g., the height of the cylinders in along the protrusion direction) may be at least 10 times (or 20 times) the thickness of the membrane 12, 312. The elongation of each mass element along the protrusion direction may be larger than the elongations of each mass element in the planar directions.

In examples above, the mutual displacement of the different mass elements replicate the shape (or even the symmetry) of the membrane. It is in general preferable to have at least three mass elements in the case of the multiple, mass-concentrated mass elements 22 (e.g., in FIGS. 1a-3b), because two only mass elements 22 could incur the risk of be subjected to one tilting mode according to a tilting oscillation exerted perpendicularity to the distance between the two mass elements. Notwithstanding, some amount of advantage would notwithstanding be obtained, since at least oscillations exerted along the distance between the two mass elements would be compensated.

In examples above, the membrane may be considered to have a substantially constant thickness, with a tolerance of 5% or 10% or 20% (mass elements 22, 622, 623 are not considered to be part of the membrane). In some examples, there is no other element attached (e.g., suspended from, e.g. fixed to, attached to, elastically connected, to, etc.) the membrane's regions where no mass element is present. The membrane 12, 312 may have substantially uniform density and/or uniform elasticity in throughout its regions.

What is claimed is:

1. A semiconductor device comprising:
a deformable membrane having a membrane border;
a structure holding the deformable membrane in correspondence of the membrane border;
at least one electric contact configured to obtain an electric signal indicative of a deformation of the deformable membrane;
a plurality of mass elements suspended from the deformable membrane; and
a capacitor with a variable capacitance,
wherein the capacitor has a first electrode and a second electrode,
wherein the first electrode includes the deformable membrane,
wherein the capacitance is variable based on a membrane deformation conditioned by a movement of the plurality of mass elements, and
wherein the electric signal is conditioned by the capacitance.

2. The semiconductor device of claim 1, wherein the mass elements are each subjected to a movement so that the movements generate one translatorily oscillating mode.

3. The semiconductor device of claim 1, wherein a center of mass of the plurality of mass elements is positioned in a centered position of the deformable membrane.

4. The semiconductor device of claim 1, wherein the deformable membrane is a piezoelectric membrane electrically connected to the at least one electric contact, and wherein the deformation of the deformable membrane, conditioned by the movement of the plurality of mass elements, causes a variation of the electric signal.

5. The semiconductor device of claim 1, wherein the deformable membrane is subjectable to a flow of an electric current, and wherein the electric signal is conditioned by the deformation of the deformable membrane conditioned by the movement of the plurality of mass elements.

6. The semiconductor device of claim 1, wherein the deformation of the deformable membrane, at a first frequency, is conditioned by a compensation between tilting modes singularly affecting the mass elements generating a translatorily oscillating mode, and wherein the deformation of the deformable membrane is conditioned, at a second frequency different from the first frequency, by a piston mode in which the mass elements oscillate prevalently translatorily.

7. The semiconductor device of claim 1, wherein each mass element of the plurality of mass elements has a shape elongated along a protrusion direction which is transversal to a planar cross section of the mass element, and wherein an elongation of each mass element along the protrusion direction is larger than the elongation(s) of each mass element in planar directions.

8. The semiconductor device of claim 1, wherein the plurality of mass elements includes at least one off-centered mass element that is not located in a center of the deformable membrane.

9. The semiconductor device of claim 8, wherein the membrane border has a border shape, wherein at least one downscaled version of the border shape encounters, with a tolerance of 30%, the at least one off-centered mass element.

10. The semiconductor device of claim 8, wherein positions equidistant from the membrane border and a membrane center are occupied by the at least one off-centered mass element, within a tolerance of 30%.

11. The semiconductor device of claim 8, wherein the membrane border has a border shape, and the at least one off-centered mass element is placed in such a way that a plurality of positions, which within a tolerance of 30% are symmetrical with respect to at least one symmetry axis extending along a planar extension of the deformable membrane and intersecting the border shape in at least two intersection positions, are occupied by the at least one off-centered mass element.

12. The semiconductor device of claim 1, wherein no mass element is positioned at a centered position of the deformable membrane.

13. A sensor device comprising the semiconductor device of claim 1, further comprising:

analog-to-digital circuitry to convert the electric signal indicative of the deformation of the deformable membrane into a digital version; and at least one digital measurer to obtain, from the digital version of the electric signal, a measurement of at least one pressure, vibration, or acceleration.

14. A method for manufacturing a semiconductor device, the method including:

making a deformable membrane and a plurality of mass elements including at least two mass elements integral with, or fixed or mechanically connected to, the deformable membrane, in such a way that the deformable membrane has a membrane border held by a structure;

making at least one electric contact for connection to the deformable membrane so that the electrical contact is able to receive an electric signal indicative of a deformation of the deformable membrane conditioned by a movement of the at least two mass elements; and forming a capacitor with a variable capacitance, wherein the capacitor has a first electrode and a second electrode, wherein the first electrode includes the deformable membrane, wherein the capacitance is variable based on a membrane deformation conditioned by the movement of the plurality of mass elements so that the electric signal is conditioned by the capacitance.

15. A semiconductor device comprising:

a single deformable membrane having a membrane border;

a structure holding the deformable membrane in correspondence of the membrane border;

at least one electric contact configured to obtain an electric signal indicative of a deformation of the deformable membrane;

a plurality of mass elements suspended from the deformable membrane; and a capacitor with a variable capacitance, wherein the capacitor has a first electrode and a second electrode, wherein the first electrode includes the deformable membrane, wherein the capacitance is variable based on a membrane deformation, and wherein the electric signal is conditioned by the capacitance.

16. The semiconductor device of claim 15, wherein the plurality of mass elements comprises exactly four mass elements.

17. The semiconductor device of claim 15, wherein the plurality of mass elements comprises exactly three mass elements.

18. The semiconductor device of claim 15, wherein no mass element is positioned at a centered position of the deformable membrane.

19. The semiconductor device of claim 15, wherein the plurality of mass elements is integral with the deformable membrane.

20. The semiconductor device of claim 15, wherein the plurality of mass elements is fixed with the deformable membrane via an adhesive or a bond.

* * * * *